United States Patent
Cheng (10) Patent No.: US 10,615,054 B2
(45) Date of Patent: Apr. 7, 2020

(54) METHOD FOR MANUFACTURING CONDUCTIVE LINE

(71) Applicant: Unimicron Technology Corp., Taoyuan (TW)

(72) Inventor: Shih-Liang Cheng, New Taipei (TW)

(73) Assignee: UNIMICRON TECHNOLOGY CORP., Taoyuan (TW)

( * ) Notice: Subject to any disclaimer, the term of this patent is extended or adjusted under 35 U.S.C. 154(b) by 147 days.

(21) Appl. No.: 15/818,777

(22) Filed: Nov. 21, 2017

(65) Prior Publication Data

US 2019/0109017 A1  Apr. 11, 2019

(30) Foreign Application Priority Data

Oct. 11, 2017  (TW) .............................. 106134779 A (51) Int. Cl.
*H05K 3/02* (2006.01)
*H05K 3/10* (2006.01)
*H01L 21/48* (2006.01)
*H05K 3/18* (2006.01)

(52) U.S. Cl.
CPC ......... *H01L 21/4846* (2013.01); *H05K 3/107* (2013.01); *H05K 3/108* (2013.01); *H05K 3/188* (2013.01); *H05K 2201/0341* (2013.01); *H05K 2203/0588* (2013.01); *H05K 2203/1383* (2013.01)

(58) Field of Classification Search
CPC ........ H01L 21/4846; H05K 2203/0588; H05K 3/188; H05K 3/108; H05K 3/107
See application file for complete search history.

(56) References Cited

U.S. PATENT DOCUMENTS

| | | | |
|---|---|---|---|
| 4,315,985 A | 2/1982 | Castellani et al. | |
| 4,352,716 A * | 10/1982 | Schaible | C23F 4/00 204/192.32 |
| 7,517,462 B2 | 4/2009 | Cohen et al. | |
| 8,092,696 B2 * | 1/2012 | Nakamura | H05K 3/388 174/255 |
| 8,426,118 B2 * | 4/2013 | Tran | H01L 21/0337 430/317 |
| 9,171,920 B2 * | 10/2015 | Chang | H01L 29/66431 |
| 9,780,297 B2 * | 10/2017 | Lee | H01L 43/08 |
| 2006/0000637 A1 | 1/2006 | Nakamura et al. | |
| 2009/0294297 A1 | 12/2009 | Kim et al. | |
| 2015/0236109 A1 | 8/2015 | Chang et al. | |

FOREIGN PATENT DOCUMENTS

| | | |
|---|---|---|
| CN | 1610488 A | 4/2005 |
| JP | H0245996 A | 2/1990 |
| TW | 511430 B | 11/2002 |
| TW | 200501852 A | 1/2005 |
| TW | 200603707 A | 1/2006 |
| TW | 200845245 A | 11/2008 |

* cited by examiner

*Primary Examiner* — Paul D Kim
(74) *Attorney, Agent, or Firm* — CKC & Partners Co., LLC (57) ABSTRACT

A method for manufacturing conductive lines is provided. A first metal layer is formed over a carrier substrate. A second metal layer is formed over the first metal layer. A plurality of first conductive lines is formed on the second metal layer. A protective layer is formed on opposite sidewalls of the first conductive lines. An exposed portion of the second metal layer is removed to expose a portion of the first metal layer. The exposed portion of the first metal layer is removed, and the protective layer is removed.

16 Claims, 11 Drawing Sheets

METHOD FOR MANUFACTURING CONDUCTIVE LINE

CROSS-REFERENCE TO RELATED APPLICATION

This application claims priority to Taiwan Application Serial Number 106134779, filed Oct. 11, 2017, which is herein incorporated by reference.

BACKGROUND

Field of Invention

The present invention relates to a method for manufacturing conductive lines. More particularly, the present invention relates to a method for manufacturing ultra-fine lines.

Description of Related Art

Circuit board plays an important role in an electronic device. Conductive lines on circuit board are used for defining a predetermined pattern over a solid surface. As electronic devices have been continuously scaling down, line width and line space on circuit board have decreased, accordingly.

Generally, a seed layer is formed over a substrate to enhance adhesion between the substrate and an overlying metal layer, such as a copper (Cu) layer. However, decreased line width and line space and inconsistent line space of conductive lines may result in, for example, the conductive lines within a region having intense line space are still under-etched, but conductive lines within another region having sparse line space are over-etched. It may lead to open circuit or suspended lines, and further influence the device performance. Accordingly, an improved method is needed for addressing such issues.

SUMMARY

The present disclosure provides a method for manufacturing conductive lines including forming a first metal layer over a carrier substrate; forming a second metal layer over the first metal layer; forming a plurality of first conductive lines over the second metal layer; forming a protective layer on opposite sidewalls of the first conductive lines; removing an exposed portion of the second metal layer to expose a portion of the first metal layer; removing the exposed portion of the first metal layer; and removing the protective layer.

In the present disclosure, a protective layer if formed on opposite sidewalls of conductive lines, such that the conductive lines may prevent from lateral etching during the etching processes. As such, the final conductive lines may have stable quality. Also, conductive lines with higher etching rate may prevent from over etching that causes open circuit and suspended lines. On the other hand, capping layers are formed over conductive lines, such that the conductive lines may prevent from vertical etching during the etching processes. As such, the final conductive lines can have stable quality.

BRIEF DESCRIPTION OF THE DRAWINGS

The invention can be more fully understood by reading the following detailed description of the embodiment, with reference made to the accompanying drawings as follows.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1A to 1H illustrate a method of manufacturing a semiconductor device at various stages in accordance with some embodiments.

Figure 1A:
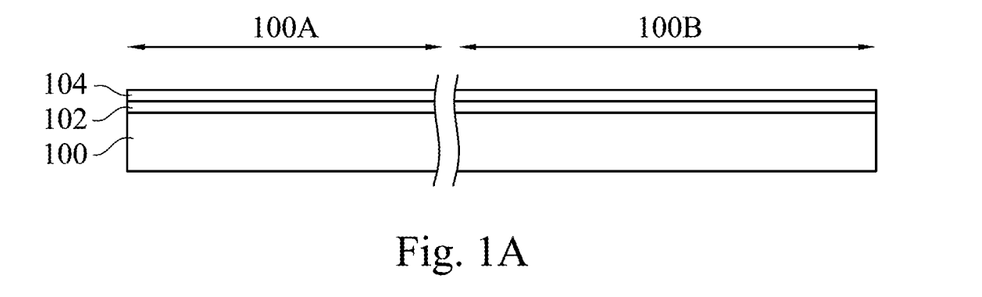
FIGS. 1A to 1H illustrate a method of manufacturing a semiconductor device at various stages in accordance with some embodiments.

Reference is made to FIG. 1A. A carrier substrate 100 is provided. The carrier substrate 100 may be a printed circuit board, a glass substrate, a ceramic substrate, a plastic substrate, or a combination thereof, but is not limited thereto. The carrier substrate 100 includes a first region 100A and a second region 100B. The first region 110A and the second region 100B may be two connected regions over the carrier substrate 100, and may also be two separated regions at different positions of the carrier substrate 100. In some embodiments, the carrier substrate 100, for example, may be an inner substrate of a printed circuit board for supporting conductive circuits to be formed in the following processes. The carrier substrate 100 may be made from Prepreg, such as glass epoxy (FR-4) substrate, bismaleimide-triazine (BT) substrate. Alternatively, the carrier substrate 100 may be an insulating layer over conductive layers, and may be made from epoxy or other suitable insulating materials.

A metal layer 102 and a metal layer 104 are formed over the carrier substrate 100. In some embodiments, the metal layer 102 is formed over the carrier substrate 100, and metal layer 104 is then formed over the metal layer 102. The metal layers 102 and 104 may be formed by suitable process, such as sputter, or other suitable deposition processes. In some embodiments, the metal layer 102 may be made of titanium (Ti) or titanium tungsten (TiW) alloy. The thickness of the metal layer 102 may be in a range from about 5 nm to about 200 nm. The thickness of the metal layer 102 in some embodiments preferably may be 50 nm, but the present disclosure is not limited thereto. On the other hand, the metal layer 104 may be made of Au, Cu, Ag, Zn, Al, Ni, Sn, the combination alloy thereof, or may be made of conductive polymeric materials. The thickness of the metal layer 104 may be in a range from about 50 nm to about 700 nm. The thickness of the metal layer 104 in some embodiments preferably may be 300 nm, but the present disclosure is not limited thereto. In some embodiments, the metal layer 102 may act as an adhesive layer between the carrier substrate 100 and the metal layer 104 to enhance adhesion therebetween. The metal layer 104 may act as a seed layer for conductive lines to be formed in later processes, and may also be referred to as a seed layer 104.

Figure 1B:
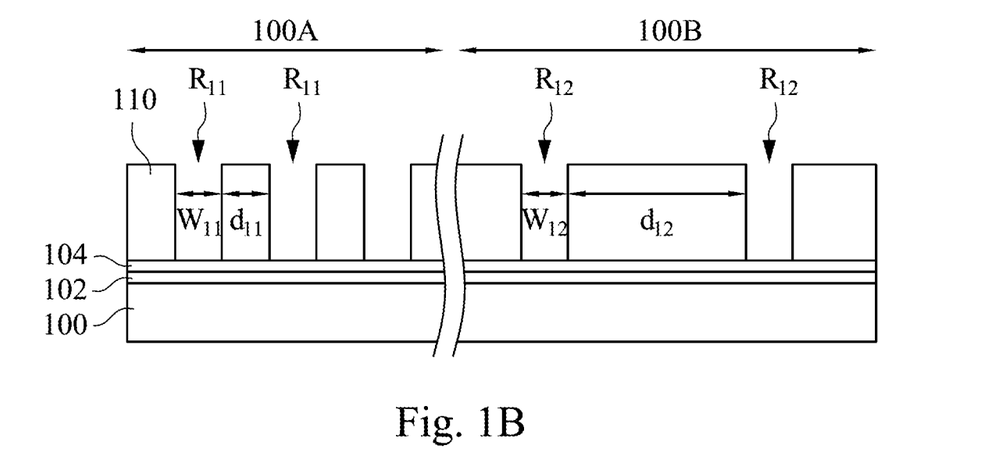

Reference is made to FIG. 1B. A photoresist layer 110 is formed over the carrier substrate 100 and the metal layers 102 and 104. The photoresist layer 110 is patterned, such that a plurality of recesses $R_{11}$ is formed in the photoresist layer 110 within the first region 100A of the carrier substrate 100, and a plurality of recesses $R_{12}$ is formed in the photoresist layer 110 within the second region 100B of the carrier substrate 100. The recesses $R_{11}$ and $R_{12}$ expose the top surface of the underlying metal layer 104. In some embodiments, the photoresist layer 110 may be photoresist, and may be patterned by a photolithography process, such as photography and development.

The recesses $R_{11}$ have a width $W_{11}$, and the recesses $R_{12}$ have a width $W_{12}$, respectively. In some embodiments, the width $W_{11}$ is substantially equal to the width $W_{12}$, but the present disclosure is not limited thereto. In some other embodiments, the width $W_{11}$ is different from the width $W_{12}$. On the other hand, the distance between two adjacent recesses $R_{11}$ is $d_{11}$, and the distance between two adjacent recesses $R_{12}$ is $d_{12}$. In some embodiments, the distance $d_{11}$ is smaller than the distance $d_{12}$. State differently, the spacing between two adjacent recesses $R_{11}$ within the first region 100A of the carrier substrate 100 is smaller than the spacing between two adjacent recesses $R_{12}$ within the second region 100B of the carrier substrate 100.

Figure 1C:
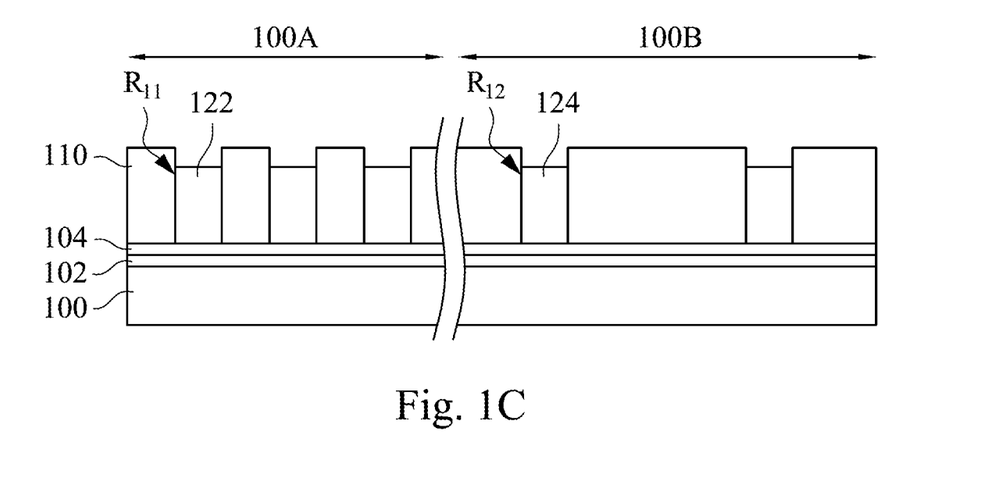

Reference is made to FIG. 1C. Conductive lines 122 and 124 are formed respectively in the recesses $R_{11}$ and $R_{12}$. In some embodiments, the conductive lines 122 and 124 may be formed by using the exposed metal layer 104 as a seed layer, and filling a conductive material into the recesses $R_{11}$ and $R_{12}$ by suitable process, such as electroplating process. The conductive material filled in the recesses $R_{11}$ can be referred to as the conductive lines 122, and conductive material filled in the recesses $R_{12}$ can be referred to as the conductive lines 124. The conductive lines 122 and 124 may be formed in the same process (at the same time). In some embodiments, the material of the conductive lines 122 and 124 may be the same as that of the metal layer 104, such as Au, Cu, Ag, Zn, Al, Ni, Sn, other suitable metal, the combination alloy thereof, or may be conductive polymeric materials.

Figure 1D:
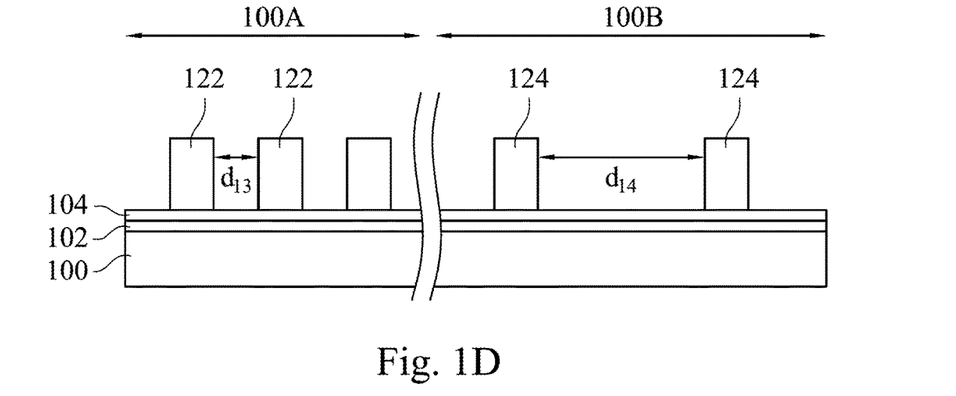

Reference is made to FIG. 1D. The photoresist layer 110 (referring to FIG. 1C) is removed to expose opposite sidewalls of the conductive lines 122 and 124, and a portion of the top surface of the metal layer 104. As mentioned, since the spacing between two adjacent recesses $R_{11}$ within the first region 100A of the carrier substrate 100 is smaller than the spacing between two adjacent recesses $R_{12}$ within the second region 100B of the carrier substrate 100 (referring to FIG. 1C). Accordingly, distance $d_{13}$ between two adjacent conductive lines 122 is smaller than distance $d_{14}$ between two adjacent conductive lines 124.

Figure 1E:
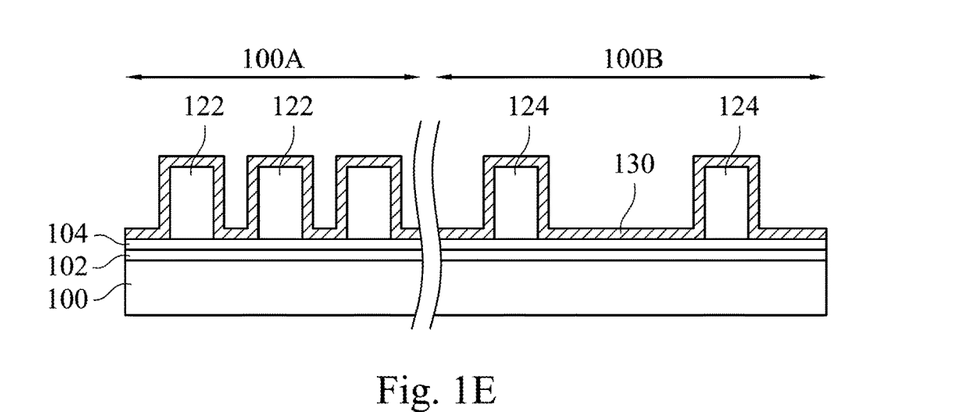

Reference is made to FIG. 1E. A protective layer 130 is formed over the carrier substrate 100. The thickness of the protective layer 130 may be in a range from about 5 nm to about 300 nm. The thickness of protective layer 130 in some embodiments may preferably be 50 nm, but the present disclosure is not limited thereto. The protective layer 130 may be formed by suitable process having good step coverage property, such as vacuum sputter, chemical plating, evaporation, or a combination thereof. Thus, the protective layer 130 is substantially conformal to the conductive lines 122 and 124, and the exposed top surface of the metal layer 104. In other words, the protective layer 130 covers the top surface and side sidewalls of the conductive lines 122 and 124, and the exposed top surface of the metal layer 104.

The material of the protective layer 130 and the material of the conductive lines 122 and 124 preferably have an etching selectivity, such that the protective layer 130 may protect the conductive lines 122 and 124 in the following processes, such as an etching process. The protective layer 130 may be made of metal, metal oxide, or a combination thereof. In some embodiments, metal can be W, Ni, Cr, Cu, V, Mo, Zn, Co, Fe. Ti, Al, Nb, or a combination alloy thereof. Metal oxide can be oxide of W, Ni, Cr, Cu, V, Mo, Zn, Co, Fe. Ti, Al, Nb, or a combination alloy thereof. It is noted that the protective layer 130 may be different from the conductive lines 122 and 124 to provide etching selectivity. In some other embodiments, the protective layer 130 and the metal layer 102 may be made from the same material.

Figure 1F:
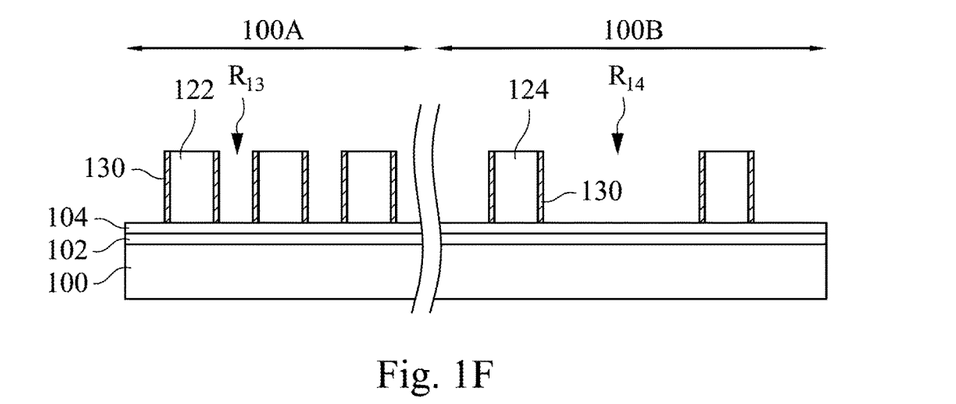

Reference is made to FIG. 1F. The protective layer 130 is partially removed, such that the remained protective layer 130 adheres to opposite sidewalls of the conductive lines 122 and 124. In other words, the protective layer 130 adhering to the top surface of the metal layer 104 is removed. After the protective layer 130 is partially removed, recesses $R_{13}$ are formed between two adjacent conductive lines 122, and recesses $R_{14}$ are formed between two adjacent conductive lines 124, in that the opposite sides of the recesses $R_{13}$ and $R_{14}$ are defined by the protective layer 130 on the conductive lines 122 and 124, respectively. Further, bottoms of the recesses $R_{13}$ and $R_{14}$ are defined by the metal layer 104.

In some embodiments, the protective layer 130 over the top surfaces of the conductive lines 122 and 124 are also removed, as illustrated in FIG. 1F. That is, after the protective layer 130 is partially removed, a portion of the top surface of the metal layer 104 and top surfaces of the conductive lines 122 and 124 are exposed. In some other embodiments, the protective layer 130 over the top surfaces of the conductive lines 122 and 124 are not completely removed. That is, a portion of the protective layer 130 remains on the top surfaces of the conductive lines 122 and 124. The protective layer 130 may be removed by suitable process, such as one or more etching processes. In some embodiments, the etching processes may be anisotropic, such as laser etching. In variant embodiments, an anisotropic plasma etching may also be employed, but the present disclosure is not limited thereto.

Figure 1G:
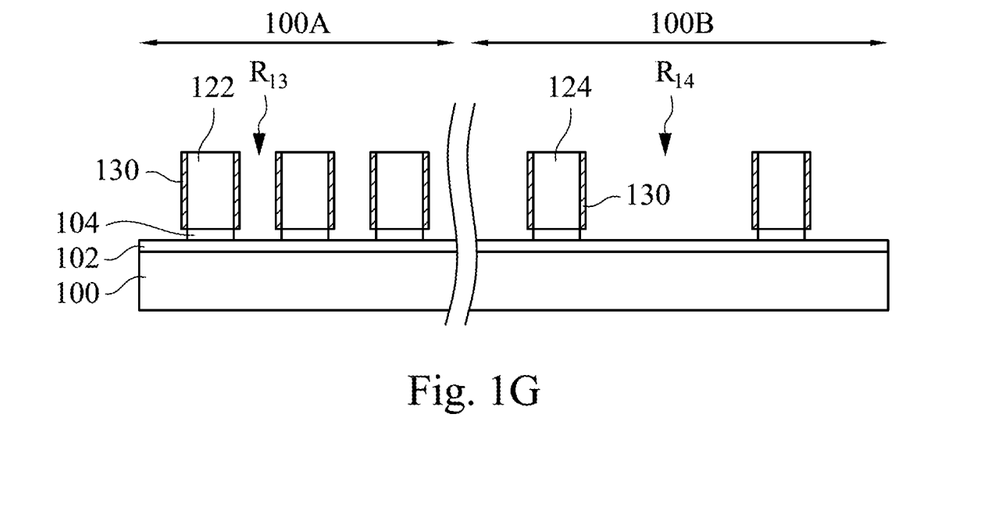

Reference is made to FIG. 1G. The metal layer 104 is partially removed through the recesses $R_{13}$ and $R_{14}$, such that the top surface of the metal layer 102 is exposed through the recesses $R_{13}$ and $R_{14}$. In some embodiments, the metal layer 104 may be removed by suitable process, such as one or more etching processes. In some embodiments, the etching processes may be isotropic, such as wet etching. The remained metal layer 104 is disposed between and in contact with the conductive lines 122, 124 and the metal layer 102. That is to say, removing the metal layer 104 is controlled such that the metal layer 104 between the conductive lines 122, 124 and the metal layer 102 should not be cut off to prevent from suspended lines.

Figure 1H:
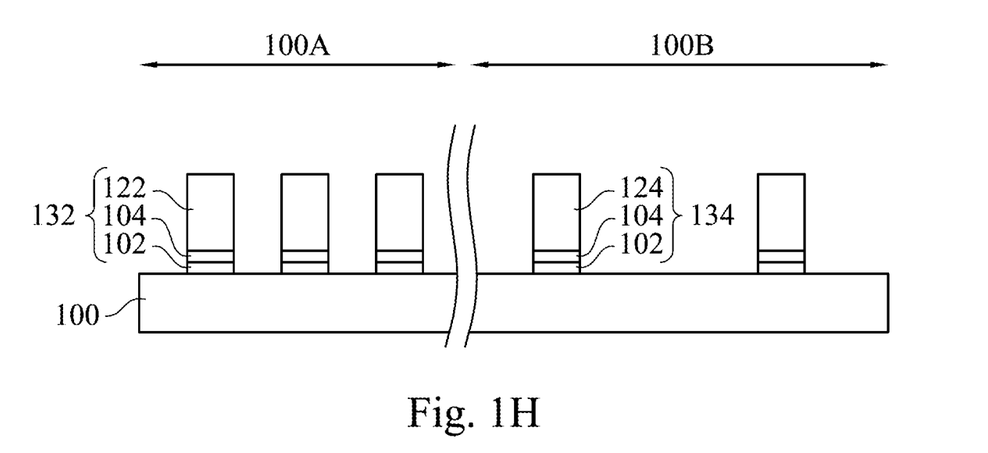

Reference is made to FIG. 1H. The protective layer 130 is removed, and the metal layer 102 is partially removed. Removing the protective layer 130 is such that the opposite sidewalls of the conductive lines 122 and 124 are exposed. On the other hand, partially removing the metal layer 102 is such that the top surface of the carrier substrate 100 is exposed. After the removal, the remained metal layers 102, 104 and the conductive lines 122 may be collectively referred to as conductive lines 132. On the other hand, the remained metal layers 102, 104 and the conductive lines 124 may be collectively referred to as conductive lines 134.

In some embodiments, the metal layer 102 may be removed by suitable process, such as one or more etching processes. In some embodiments, the etching processes may be isotropic, such as wet etching. The remained metal layer 102 is disposed between and in contact with the metal layer 104 and the carrier substrate 100. That is to say, removing the metal layer 102 is controlled such that the metal layer 102 between the metal layer 104 and the carrier substrate 100 should not be cut off to prevent from suspended lines. In some embodiments, since the metal layer 102 and the protective layer 130 may be made from the same material, such as Ti or TiW alloy, the metal layer 102 and the protective layer 130 may be removed in one etching process.

As discussed above, according to the layout design, the spacing between two adjacent conductive lines 122 is smaller than that between two adjacent conductive lines 124. However, since some processes, such as etching process, may be applied to the first region 100A and the second region 110B of the carrier substrate 100 at the same time, the conductive lines 122 and 124 having different line spaces may have different etching rates. For example, the conductive lines 124 having greater spacing may have etching rate higher than that of the conductive lines 122 having smaller spacing. In the present disclosure, the protective layer 130 is formed on opposite sidewalls of the conductive lines 122 and 124, such that the conductive lines 122 and 124 may prevent from lateral etching during the etching processes. As such, the final conductive lines 132 and 134 may have stable quality. Further, the conductive lines 124 having greater etching rate may prevent from over etching that causes open circuit and suspended lines.

FIGS. 2A to 2J illustrate a method of manufacturing a semiconductor device at various stages in accordance with some embodiments. Descriptions in FIGS. 2A to 2J similar to those described in FIGS. 1A to 1H will not be repeated again for simplicity.

Figure 2A:
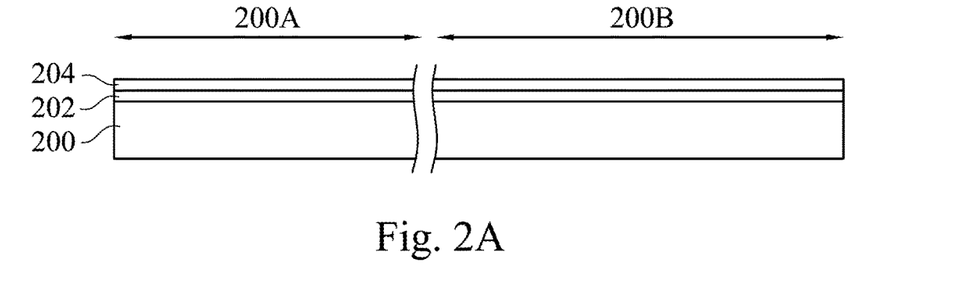
FIGS. 2A to 2J illustrate a method of manufacturing a semiconductor device at various stages in accordance with some embodiments.

Reference is made to FIG. 2A, in which FIG. 2A is similar to FIG. 1A. A carrier substrate 200 is provided, in which the carrier substrate 200 includes a first region 200A and a second region 200B. Then, a metal layer 202 and a metal layer 204 are formed over the carrier substrate 200.

Figure 2B:
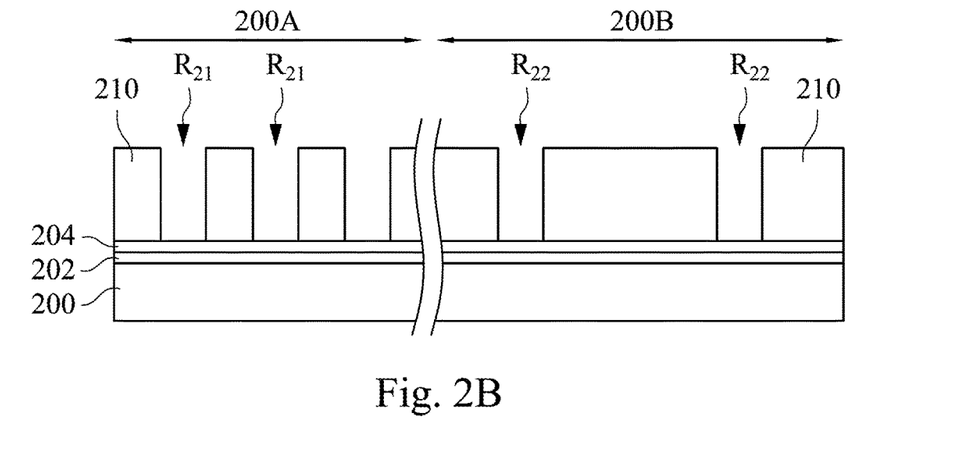

Reference is made to FIG. 2B, in which FIG. 2B is similar to FIG. 1B. A photoresist layer 210 is formed over the carrier substrate 200 and the metal layers 202 and 204. The photoresist layer 210 is patterned, such that plural recesses $R_{21}$ is formed in the photoresist layer 210 within the first region 200A of the carrier substrate 200, and plural recesses $R_{22}$ is formed in the photoresist layer 210 within the second region 200B of the carrier substrate 200. The recesses $R_{21}$ and $R_{22}$ expose the top surface of the underlying metal layer 204. Similar to FIG. 1B, the spacing between two adjacent recesses $R_{21}$ is smaller than the spacing between two adjacent recesses $R_{22}$.

Figure 2C:
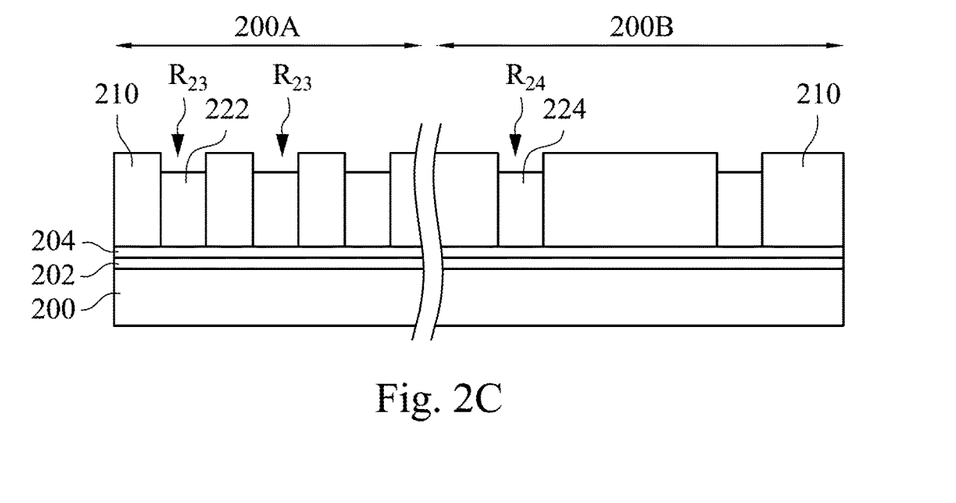

Reference is made to FIG. 2C. Conductive lines 222 and 224 are formed respectively in the recesses $R_{21}$ and $R_{22}$. The materials of the conductive lines 222 and 224 and the manufacturing method thereof is similar to those described in FIG. 1C, and will not be repeated again. In the present disclosure, the conductive lines 222 and 224 are partially filled in the recesses $R_{21}$ and $R_{22}$. The recesses $R_{21}$ and $R_{22}$ over the conductive lines 222 and 224 (the unfilled portions of the recesses $R_{21}$ and $R_{22}$) are referred to as recesses $R_{23}$ and $R_{24}$ in the following descriptions. The bottoms of the recesses $R_{23}$ and $R_{24}$ are defined by the conductive lines 222 and 224, respectively.

Figure 2D:
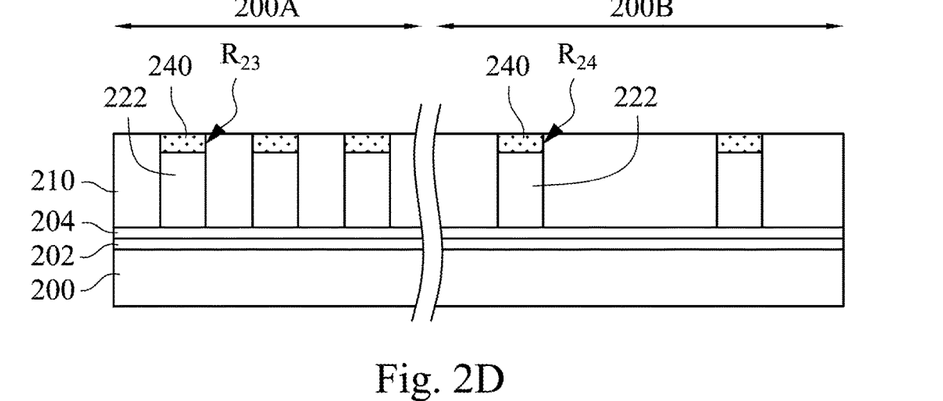

Reference is made to FIG. 2D. Capping layers 240 are formed in the recesses $R_{23}$ and $R_{24}$. In other words, the capping layers 240 cover the top surfaces of the conductive lines 222 and 224, and may protect the top surfaces of the conductive lines 222 and 224 in the following processes, such as etching process. In some embodiments, the capping layers 240 may be formed by suitable process, such as electroplating process. The capping layers 240 may be made of metal, metal oxide, or a combination thereof. In some embodiments, metal can be W, Ni, Cr, Cu, V, Mo, Zn, Co, Fe. Ti, Al, Nb, or combination alloy thereof. Metal oxide can be oxide of W, Ni, Cr, Cu, V, Mo, Zn, Co, Fe. Ti, Al, Nb, or combination alloy thereof. It is noted that the capping layers 240 may be different from the conductive lines 222 and 224 to provide etching selectivity.

Figure 2E:
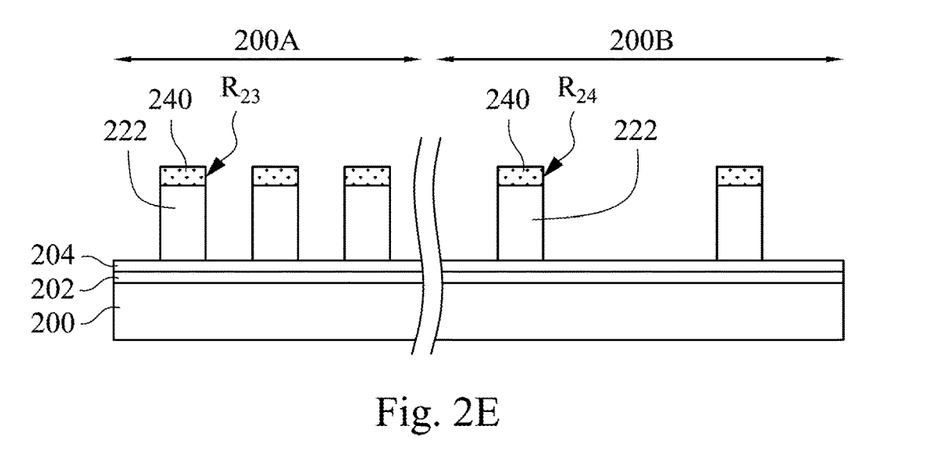

Reference is made to FIG. 2E, in which FIG. 2E is similar to FIG. 1D. The photoresist layer 210 (referring to FIG. 2D) is removed to expose opposite sidewalls of the conductive lines 222 and 224, and a portion of the top surface of the metal layer 204. After the photoresist layer 210 is removed, the capping layers 240 still remain on the top surfaces of the conductive lines 222 and 224.

Figure 2F:
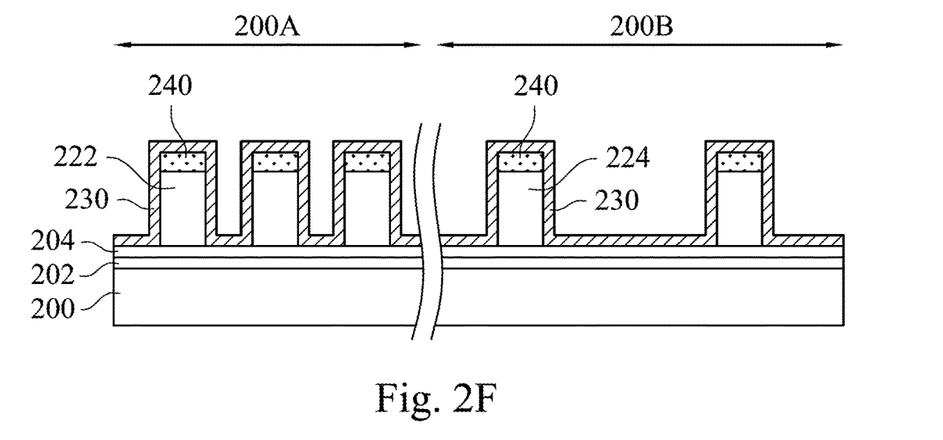

Reference is made to FIG. 2F, in which FIG. 2F is similar to FIG. 1E. A protective layer 230 is formed over the carrier substrate 200. The protective layer 230 is substantially conformal to the conductive lines 222 and 224, and the exposed top surface of the metal layer 204. In some embodiments, the material of the protective layer 230 and the material of the capping layers 240 may be different to provide etching selectivity.

Figure 2G:
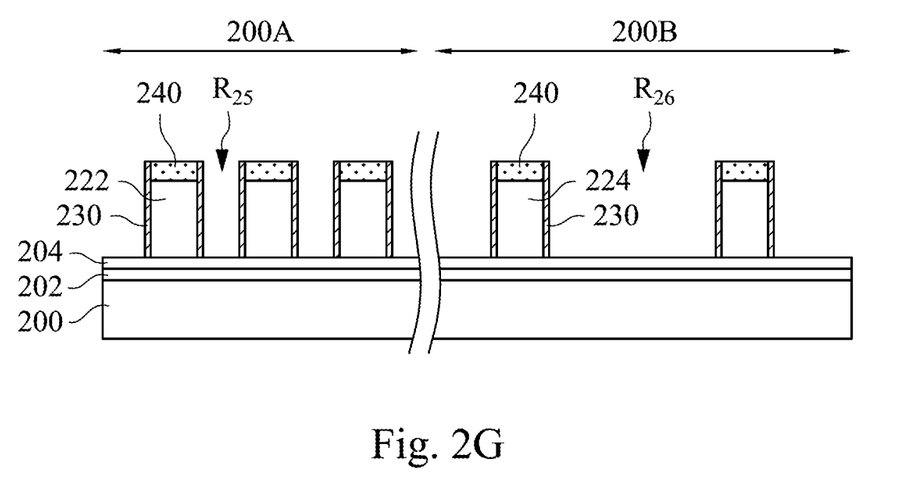

Reference is made to FIG. 2G, in which FIG. 2G is similar to FIG. 1F. The protective layer 230 is partially removed, such that the remained protective layer 230 adheres to opposite sidewalls of the conductive lines 222 and 224, and opposite sidewalls of the capping layers 240. After the protective layer 230 is partially removed, recesses $R_{25}$ are formed between two adjacent conductive lines 222, and recesses $R_{26}$ are formed between two adjacent conductive lines 224, such that the top surface of the metal layer 204 is exposed from the recesses $R_{25}$ and $R_{26}$. In some embodiments, a portion of the protective layer 230 above the capping layers 240 is also removed, such that the top surfaces of the capping layers 240 are exposed. The exposed capping layers 240 may protect the underlying conductive lines 222 and 224 in the following processes.

Figure 2H:
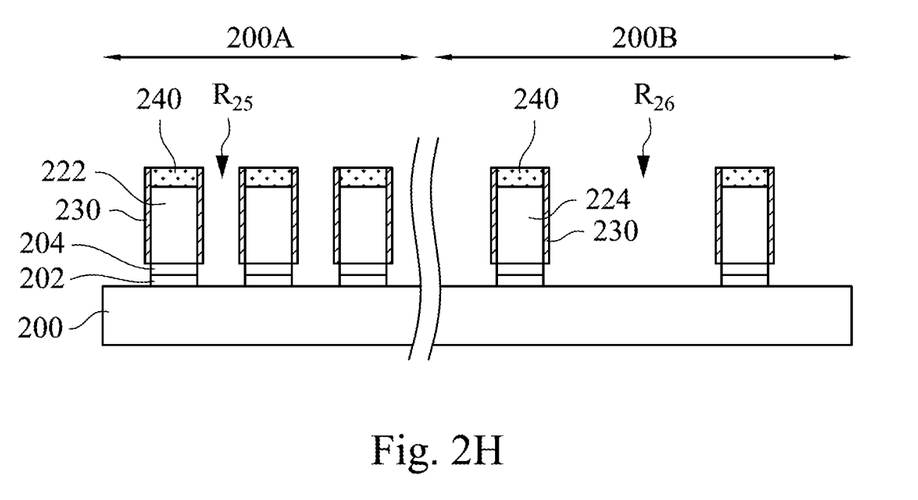

Reference is made to FIG. 2H. The metal layer 204 and the metal layer 202 are partially removed through the recesses $R_{25}$ and $R_{26}$. In some embodiments, the metal layer 204 and the metal layer 202 may be removed by one or more etching processes to expose a portion of the top surface of the carrier substrate 200. It is noted that removing the metal layers 202 and 204 is controlled such that the metal layers 202 and 204 between the conductive lines 222, 224 and the carrier substrate 200 should not be cut off.

Figure 2I:
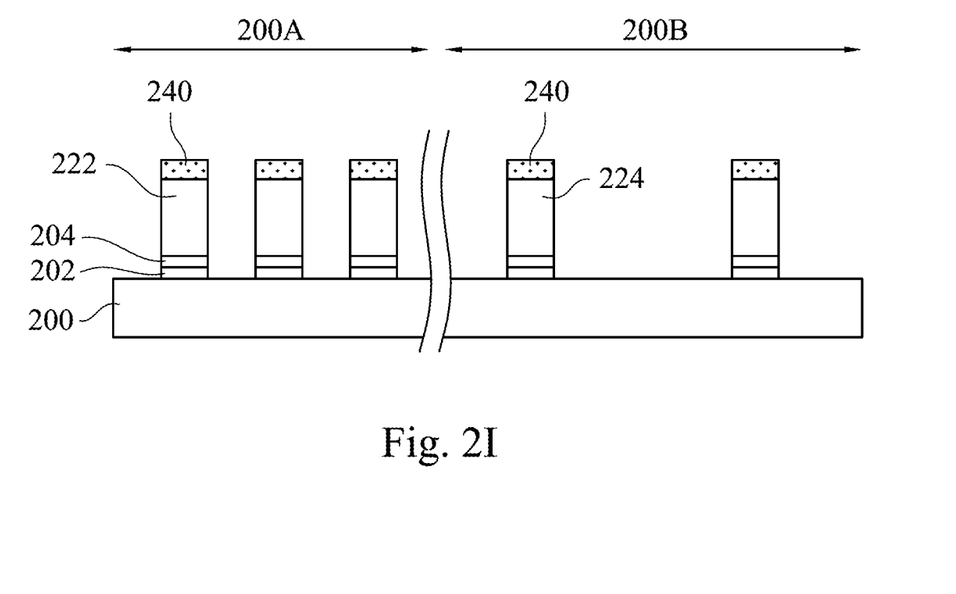

Reference is made to FIG. 2I. The protective layer 230 is removed. After the protective layer 230 is removed, the opposite sidewalls of the conductive lines 222 and 224 are exposed. In some embodiments, the protective layer 230 and the capping layers 240 have etching selectivity, and thus the capping layers 240 are remained on the conductive lines 222 and 224 after the protective layer 230 is removed.

Figure 2J:
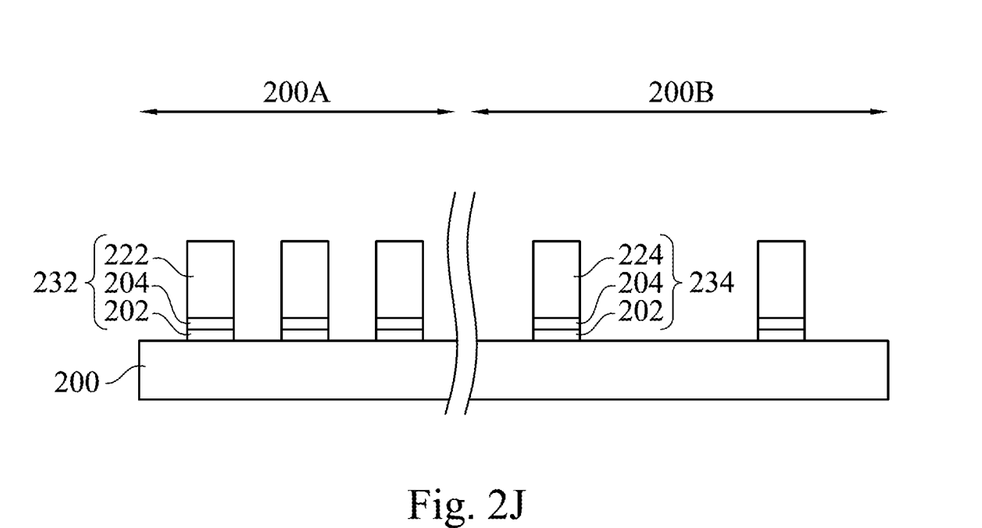

Reference is made to FIG. 2J. The capping layers 240 are removed (referring to FIG. 2I). In some embodiments, the capping layers 240 may be removed by suitable process, such as one or more etching process. In some embodiments, the etching process may be isotropic etching, such as wet etching. After the removal, the remained metal layers 202, 204 and the conductive lines 222 may be collectively referred to as conductive lines 232. On the other hand, the remained metal layers 202, 204 and the conductive lines 224 may be collectively referred to as conductive lines 234.

As discussed above, the protective layer 230 is formed on opposite sidewalls of the conductive lines 222 and 224, such that the conductive lines 222 and 224 may prevent from lateral etching during the etching processes. As such, the final conductive lines 232 and 234 may have stable quality. Further, the conductive lines 224 having higher etching rate may prevent from over etching that causes open circuit and suspended lines. Also, in the present disclosure, the capping layers 240 are formed over the conductive lines 222 and 224, such that the conductive lines 222 and 224 may prevent from vertical etching during the etching processes. As such, the final conductive lines 232 and 234 may have stable quality.

FIGS. 3A to 3L illustrate a method of manufacturing a semiconductor device at various stages in accordance with some embodiments. Descriptions in FIGS. 3A to 3L similar to those described in FIGS. 1A to 1H and 2A to 2J will not be repeated again for simplicity.

Figure 3A:
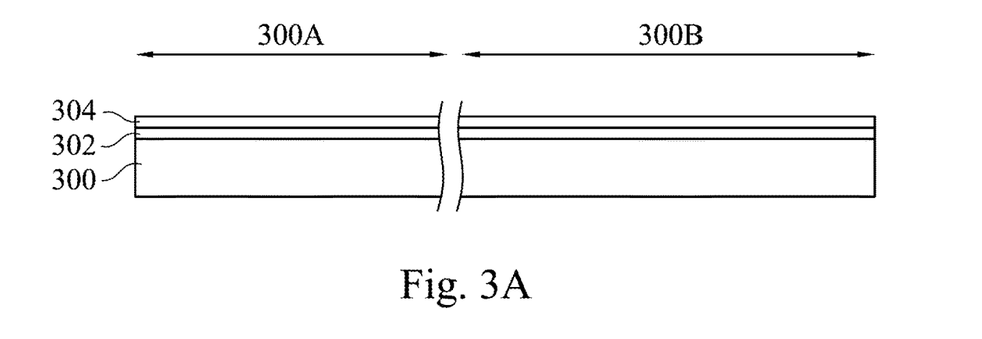
FIGS. 3A to 3L illustrate a method of manufacturing a semiconductor device at various stages in accordance with some embodiments.

Reference is made to FIG. 3A, in which FIG. 3A is similar to FIG. 1A. A carrier substrate 300 is provided, in which the carrier substrate 300 includes a first region 300A and a second region 300B. Then, a metal layer 302 and a metal layer 304 are formed over the carrier substrate 300.

Figure 3B:
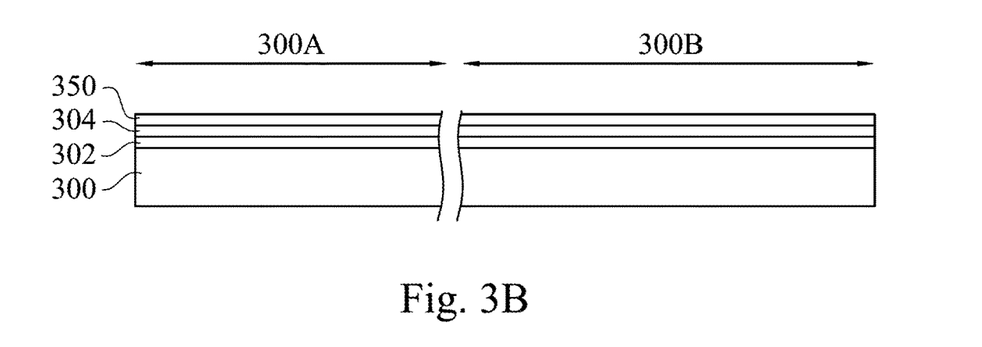

Reference is made to FIG. 3B. A first photoresist layer 350 is formed over the metal layer 304. The first photoresist layer 350 may be formed by suitable process, such as lamination, coating, or spin coating. In some embodiments, the first photoresist layer 350 can be a solvent-soluble photoresist. For example, the first photoresist layer 350 may be I-line photoresist, KrF photoresist, ArF photoresist, F2 photoresist, extreme ultraviolet (EUV) photoresist, electron-beam (EB) photoresist, or a combination thereof. In some embodiments, the thickness of the first photoresist layer 350 may be in a range from about 0.1 μm to about 10 μm.

Figure 3C:
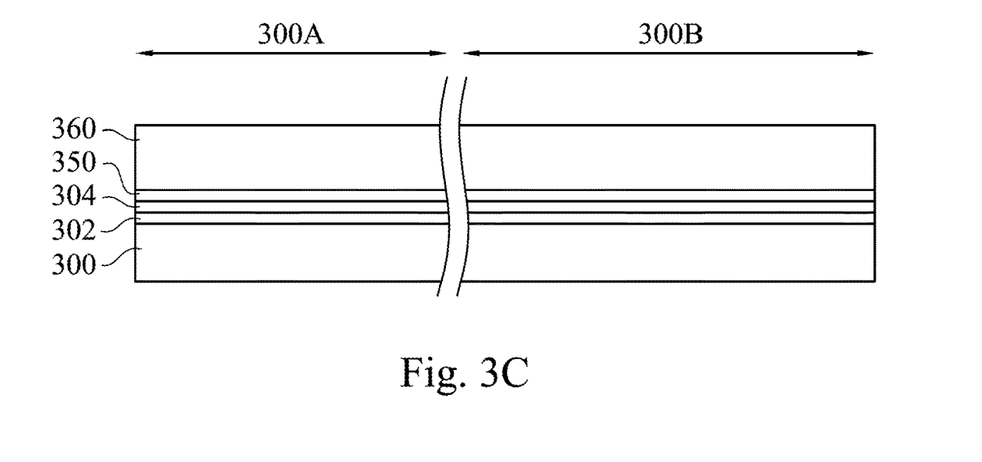

Reference is made to FIG. 3C. A second photoresist layer 360 is formed over the first photoresist layer 350. In some embodiments, the second photoresist layer 360 can be a water-soluble photoresist, which basic components include a polymer, a photoactive compound, inhibitor, crosslinker, and solvent.

The described polymer may be a water-soluble polymer, accounting for the weight of the water-soluble negative resist percentage may be between about 4% to about 8%, and may include polyvinyl acetal (polyvinylacetal), poly vinyl pyrrolidone (polyvinyl pyrrolidone; PVP), polyalkylene propionic acid (polyallylic Acid), polyvinyl alcohol (polyvinyl alcohol; PVA), polyethyleneimine (polyethyleneimine), polyethylene oxide (polyethylene oxide; PEO), or polyvinyl amine (polyvinylamine). The present disclosure is not limited thereto.

The described photoactive compounds may be, for example, a water-soluble photoacid generator (photo acid generator; PAG), and the photoactive compound weight percentage of the water-soluble negative resist may be between from 0.01 to 0.1%, and may be hum salt derivative (onium salt derivative) with three nitrogen benzene derivative (triazine derivative), etc., preferably may be Om salt derivative PAG2087 and PAG-C.

The described inhibitors may be, for example, water-soluble amine (amine), and this accounts for the concentration of the water-soluble photosensitive compound of negative type photoresist between about millionths 1 (parts per million; ppm) to about 30 ppm between, and may be ethylamine, dimethylamine, diethylamine, trimethylamine, triethylamine, n-propylamine, isopropylamine, second butylamine (s-butylamine), tertiary butylamine (t-butylamine), cyclohexylamine, ethylenediamine, hexamethylene diamine (hexamethylenediamine), ethanolamine (monoethanolamine; MEA), diethanolamine (diethanolamine; DEA), triethanolamine (triethanolamine; TEA), n-butyl-diethanolamine (n-butyl diethanolamine), Tetramethylammonium hydroxide (tetra-methyl ammonium hydroxide; TMAH), tetrabutylammonium hydroxide ammonium (tetra-butyl ammonium hydroxide; TBAH) and choline (choline).

The described crosslinker may be for example, a water-soluble cross-linking agent, and this photoactive compound may represent between 0.5 to 2% percent by weight of a water-soluble between the negative resist, and may be urea derivatives and melamine derivative.

The described solvent may include, for example, at least deionized water (de-ionized water; DIW), in which deionized water percentage of the weight of the water-soluble negative resist may be between 85-90%. According to the present disclosure, the water-soluble negative resist, the solvent can consist of more deionized water and isopropanol, in which the percentage by weight of a water-soluble isopropanol negative type photoresist may be between 4-7%.

Figure 3D:
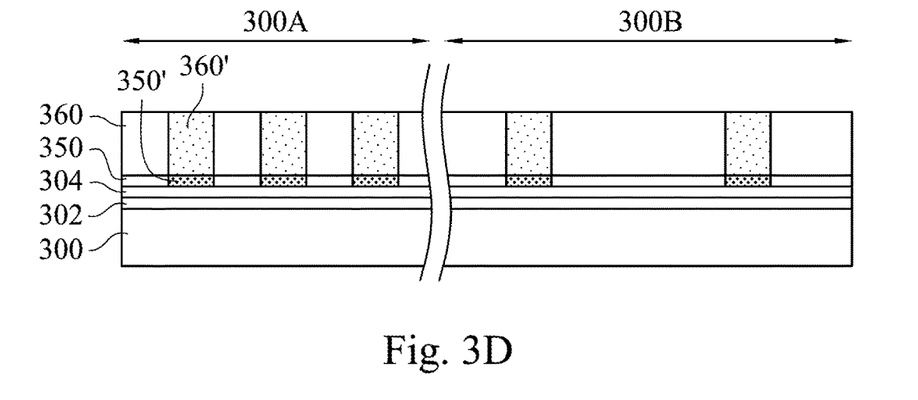

Reference is made to FIG. 3D. The first photoresist layer 350 and the second photoresist layer 360 are exposed to define portions to be removed 350' and portions to be removed 360' within the first photoresist layer 350 and the second photoresist layer 360, respectively. In some embodiments, the first photoresist layer 350 and the second photoresist layer 360 may be exposed to a light source with certain wavelength, an extreme ultraviolet light, or an electron beam at the same time. If the first photoresist layer 350 and the second photoresist layer 360 are negative photoresist, the exposed range are portions excluded from the portions to be removed 350' and portions to be removed 360'. If the first photoresist layer 350 and the second photoresist layer 360 are positive photoresist, the exposed range are portions to be removed 350' and portions to be removed 360'.

Figure 3E:
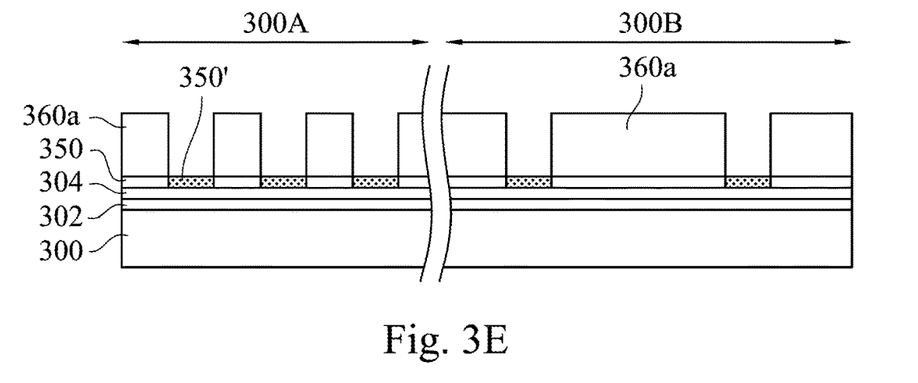

Reference is made to FIG. 3E. The portions to be removed 360' within the second photoresist layer 360 (referring to FIG. 3D) are removed. The portions to be removed 360' may be removed by suitable process, such as development process. Since the first photoresist layer 350 and the second photoresist layer 360 are made from different materials, such as water-soluble photoresist and solvent-soluble photoresist, the first photoresist layer 350 and the second photoresist layer 360 may not mixed to each other. During the development process, a water-soluble stripping solution is applied to develop a predetermined pattern. After the portions to be removed 360' are removed, the remained second photoresist layer 360 may be referred to as second photoresist layer 360a in the following processes.

Figure 3F:
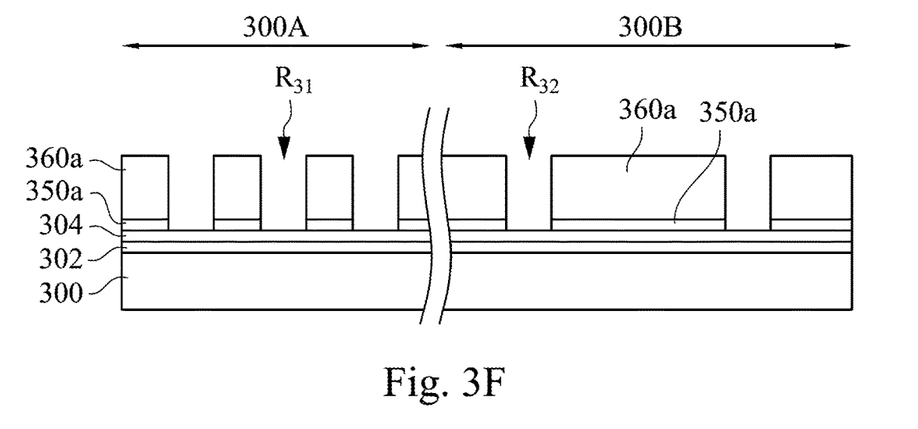

Reference is made to FIG. 3F. The portions to be removed 350' within the first photoresist layer 350 (referring to FIG. 3D) are removed. The portions to be removed 350' may be removed by suitable process, such as development process. In some embodiments, the first photoresist layer 350 is solvent-soluble photoresist, and the portions to be removed 350' may be removed by suitable developer. In some other embodiments, the portions to be removed 350' may be removed by etching process, such as laser etching process. After the portions to be removed 350' are removed, the remained first photoresist layer 350 may be referred to as first photoresist layer 350a in the following processes.

In the first region 300A of the carrier substrate 300, the first photoresist layer 350a and the second photoresist layer 360a include a plurality of recesses $R_{31}$. In the second region 300B of the carrier substrate 300, the first photoresist layer 350a and the second photoresist layer 360a include a plurality of recesses $R_{32}$. Similar to FIG. 1B, the spacing between two adjacent recesses $R_{31}$ is smaller than the spacing between two adjacent recesses $R_{32}$.

Figure 3G:
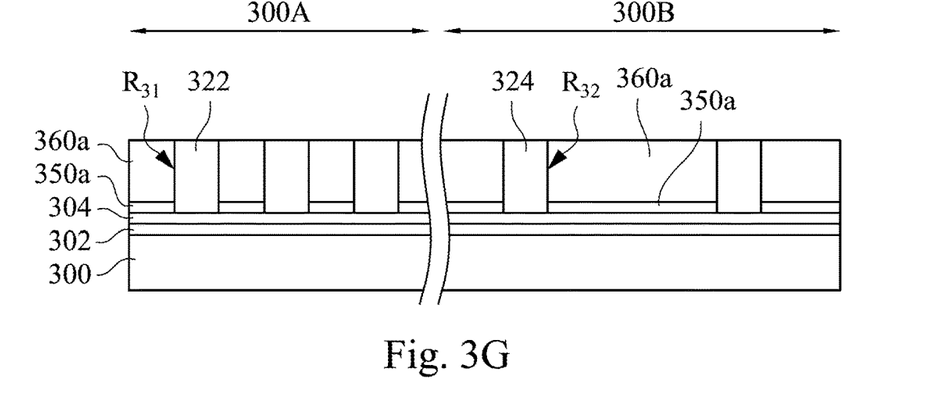

Reference is made to FIG. 3G. Conductive lines 322 and 324 are formed respectively in the recesses $R_{31}$ and $R_{32}$ of the first photoresist layer 350a and the second photoresist layer 360a, in that the spacing between two adjacent conductive lines 322 is smaller than the spacing between two adjacent conductive lines 324. The materials of the conductive lines 322 and 324 and the manufacturing method thereof is similar to those described in FIG. 1C, and will not be repeated again.

Figure 3H:
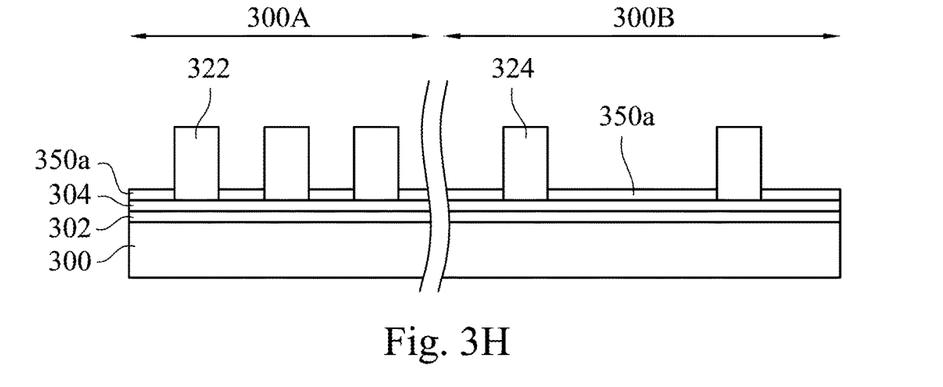

Reference is made to FIG. 3H. The second photoresist layer 360a is removed. The second photoresist layer 360a may be removed by water-soluble stripping solution. After the second photoresist layer 360a is removed, opposite sidewalls of the conductive lines 322 and 324 and the first photoresist layer 350a are exposed. In some embodiments, the first photoresist layer 350a adheres to the bottoms of the opposite sidewalls of the conductive lines 322 and 324.

Figure 3I:
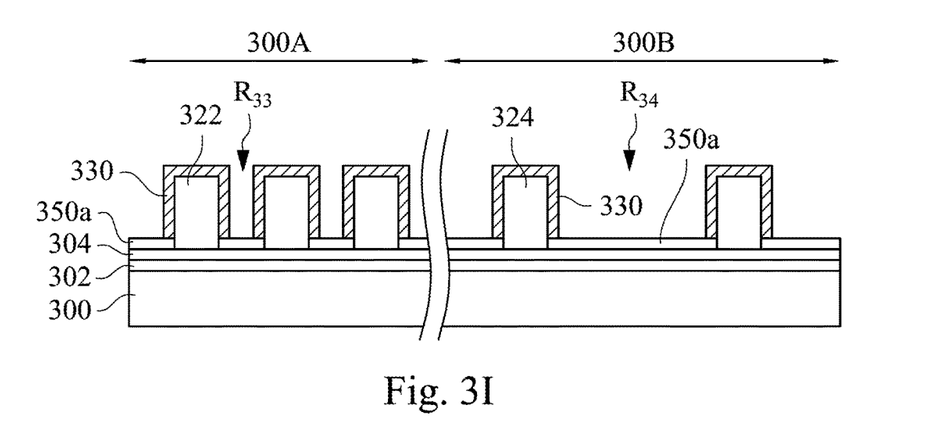

Reference is made to FIG. 3I. A protective layer 330 is formed over conductive lines 322 and 324. The protective layer 330 substantially covers the sidewalls and the top surface of the conductive lines 322 and 324. A portion of the protective layer 330 is formed over the top surface of the first photoresist layer 350a. After the protective layer 330 is formed, recesses $R_{33}$ are formed between two adjacent conductive lines 322, and recesses $R_{34}$ are formed between two adjacent conductive lines 324, respectively. In some embodiments, the protective layer 330 may be formed by electroplating, chemical plating, or immersion plating. In some embodiments, the protective layer 330 may be selectively formed, such that the protective layer 330 is substantially formed on the exposed surface of the conductive lines 322 and 324. In other words, a portion of the top surface of the first photoresist layer 350a is exposed from the recesses $R_{33}$ and $R_{34}$.

Figure 3J:
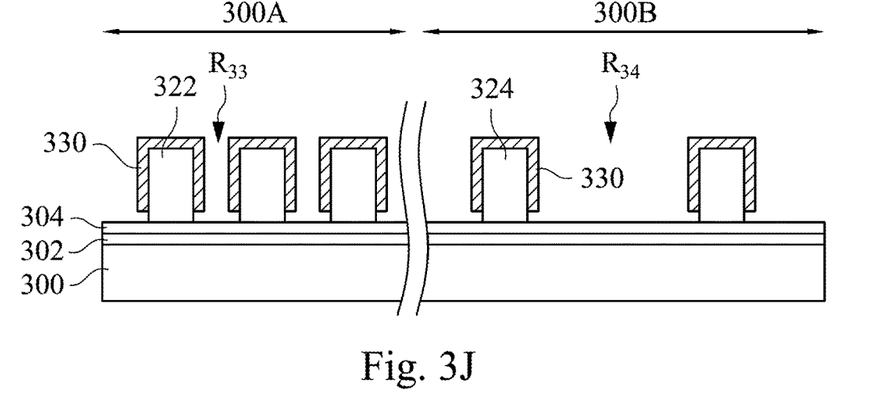

Reference is made to FIG. 3J. The first photoresist layer 350a (referring to FIG. 3I) is removed. After the first photoresist layer 350a is removed, the top surface of the metal layer 304 is exposed. In some embodiments, the first photoresist layer 350a slightly covers bottoms of the sidewalls of the conductive lines 322 and 324 (referring to FIG. 3I), and thus the bottoms of the sidewalls of the conductive lines 322 and 324 are exposed after the first photoresist layer 350a is removed.

Figure 3K:
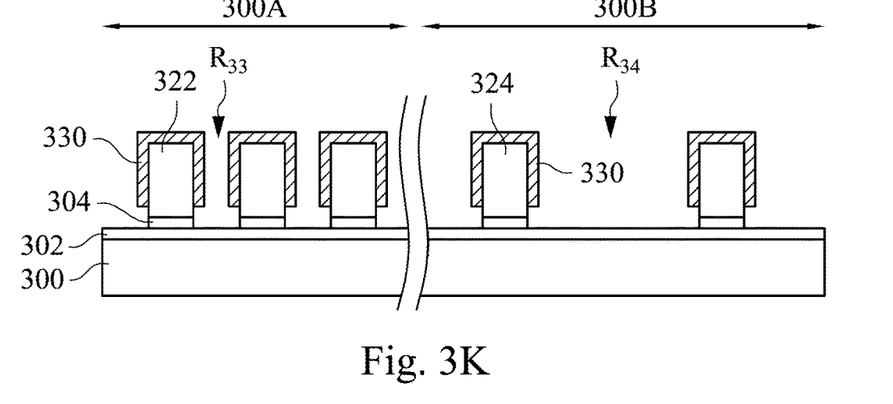

Reference is made to FIG. 3K, in which FIG. 3K is similar to FIG. 1G. The metal layer 304 is partially removed through the recesses $R_{33}$ and $R_{34}$, such that the top surface of the metal layer 302 is exposed through the recesses $R_{33}$ and $R_{34}$. The remained metal layer 304 is disposed between and in contact with the conductive lines 322, 324 and the metal layer 302.

Figure 3L:
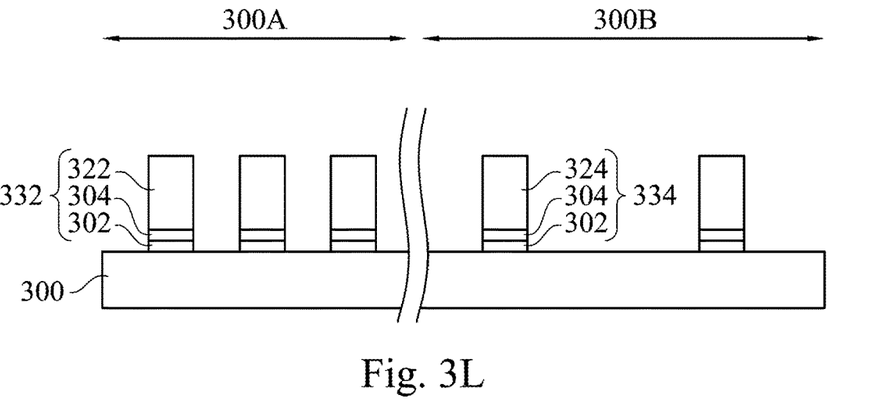

Reference is made to FIG. 3L, in which FIG. 3L is similar to FIG. 1H. The protective layer 330 is removed, and the metal layer 302 is partially removed. Removing the protective layer 330 is such that the opposite sidewalls of the conductive lines 322 and 324 are exposed. After the removal, the remained metal layers 302, 304 and the conductive lines 322 may be collectively referred to as conductive lines 332. On the other hand, the remained metal layers 302, 304 and the conductive lines 324 may be collectively referred to as conductive lines 334. In some embodiments, the protective layer 330 and the metal layer 302 may be removed at the same time.

As discussed above, in the present disclosure, the first photoresist layer 350 and the second photoresist layer 360 are formed. Then, the first photoresist layer 350 and the second photoresist layer 360 are patterned to form recesses $R_{31}$ and $R_{32}$ therein, respectively. The second photoresist layer 360 is then removed, and the protective layer 330 is formed on the opposite sidewalls and the top surfaces of the conductive lines 322 and 324, such that the final conductive lines 332 and 334 may have stable quality. Further, the conductive lines 324 having higher etching rate may prevent from over etching that causes open circuit and suspended lines.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method for manufacturing a conductive line, comprising:
    forming a first metal layer over a carrier substrate, wherein the carrier substrate has a first region and a second region;
    forming a second metal layer over the first metal layer;
    forming a plurality of first conductive lines on the second metal layer within the first region and a plurality of second conductive lines on the second metal layer within the second region, wherein a distance between two adjacent first conductive lines is smaller than that between two adjacent second conductive lines;
    forming a protective layer on opposite sidewalls of the first conductive lines and on opposite sidewalls of the second conductive lines;
    removing an exposed portion of the second metal layer to expose a portion of the first metal layer;
    removing the exposed portion of the first metal layer; and
    removing the protective layer.

2. The method of claim 1, wherein the first metal layer and the protective layer are removed at the same time.

3. The method of claim 1, wherein forming the protective layer comprises:

forming the protective layer conformal to the first conductive lines and the second metal layer; and removing a portion of the protective layer, such that the remained portion of the protective layer adheres to the opposite sidewalls of the first conductive lines, and a portion of a top surface of the second metal layer is exposed.

4. The method of claim 3, wherein removing the portion of the protective layer is such that top surfaces of the first conductive lines are exposed.

5. The method of claim 1, wherein forming the first conductive lines comprises:

forming a patterned photoresist layer over the second metal layer, wherein the patterned photoresist layer has a plurality of recesses; and filling a conductive material into the recesses to form the first conductive lines.

6. The method of claim 5, further comprising forming a plurality of capping layers into the recesses over the first conductive lines after forming the first conductive lines.

7. The method of claim 6, further comprising removing the capping layers after removing the protective layer.

8. The method of claim 6, wherein forming the protective layer comprises:

forming the protective layer conformal to the first conductive lines, the second metal layer, and the capping layers; and removing a portion of the protective layer, such that the remained portion of the protective layer adheres to the opposite sidewalls of the first conductive lines, and a portion of a top surface of the second metal layer is exposed.

9. The method of claim 8, wherein removing the portion of the protective layer is such that top surfaces of the first conductive lines are exposed.

10. The method of claim 1, wherein forming the first conductive lines comprises:

forming a first photoresist layer over the second metal layer;

forming a second photoresist layer over the first photoresist layer;

patterning the first photoresist layer and the second photoresist layer to form a plurality of recesses in the first photoresist layer and the second photoresist layer; and filling a conductive material into the recesses to form the first conductive lines.

11. The method of claim 10, wherein forming the recesses comprises:

exposing the first photoresist layer and the second photoresist layer to define a plurality of first portions to be removed and a plurality of second portions to be removed in the first photoresist layer and the second photoresist layer, respectively;

removing the second portions to be removed; and removing the first portions to be removed.

12. The method of claim 11, wherein the first photoresist layer is a solvent-soluble photoresist, and the second photoresist layer is a water-soluble photoresist.

13. The method of claim 10, further comprising removing the second photoresist layer to expose the first conductive lines before forming the protective layer.

14. The method of claim 13, further comprising removing the first photoresist layer before removing the exposed portion of the second metal layer through the protective layer.

15. The method of claim 14, wherein removing the first photoresist layer is such that bottoms of the opposite sidewalls of the first conductive lines are exposed.

16. The method of claim 1, wherein the second metal layer and the protective layer have an etching selectivity.

\* \* \* \* \*